United States Patent [19]

Schemmel et al.

[11] Patent Number: 4,634,983

[45] Date of Patent: Jan. 6, 1987

[54] CIRCUIT ARRANGEMENT FOR CONVERTING AN A.C. SIGNAL INTO A BINARY SIGNAL

[75] Inventors: Hans R. Schemmel; Hermann Schönamsgruber, both of Nuremberg, Fed. Rep. of Germany

[73] Assignee: U.S. Philips Corporation, New York, N.Y.

[21] Appl. No.: 733,274

[22] Filed: May 10, 1985

[30] Foreign Application Priority Data

May 12, 1984 [DE] Fed. Rep. of Germany ....... 3417624

[51] Int. Cl.[4] .......................... H03K 5/08; H03K 5/01; H03K 3/29

[52] U.S. Cl. ..................................... 328/28; 307/260; 307/290; 307/351; 307/261

[58] Field of Search .................................... 328/28–33; 307/354, 260, 264, 290, 351, 494, 261

[56] References Cited

U.S. PATENT DOCUMENTS 3,612,912 10/1971 Schwartz ............................. 307/290
3,666,970 5/1972 Abbott et al. ....................... 307/290

OTHER PUBLICATIONS

IBM Technical Disclosure Bulletin, Peak Detector, C. H. Ristad, vol. 15, No. 8, Jan. 1973, p. 2377.

Primary Examiner—Stanley D. Miller
Assistant Examiner—B. P. Davis
Attorney, Agent, or Firm—David R. Treacy

[57] ABSTRACT

The described circuit arrangement converts an alternating current signal into a binary signal when the level of the alternating current signal exceeds an initial threshold voltage. During the period of time in which the alternating current signal is delivered, the threshold voltage is reduced. If the level of the alternating current signal falls short of the reduced threshold voltage, then the delivery of the alternating current signal is interrupted and the threshold voltage is again increased to its initial value. This hysteresis during switch-on and switch-off of the binary signal results in either an error-free binary signal being supplied or no binary signal at all.

2 Claims, 1 Drawing Figure

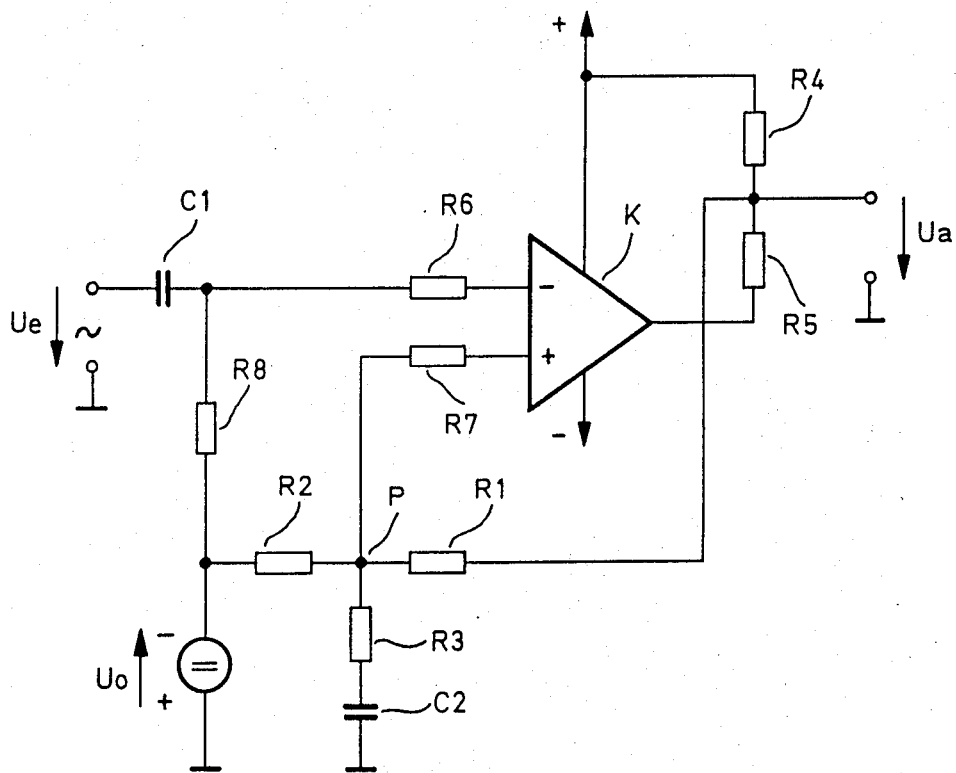

CIRCUIT ARRANGEMENT FOR CONVERTING AN A.C. SIGNAL INTO A BINARY SIGNAL

The invention relates to a circuit arrangement for converting an a.c. signal into a binary signal as described in the introductory part of patent claim 1.

A circuit arrangement having these features is, for example, required when in carrier frequency systems the carrier must be recovered or processed such that it is capable of controlling digital modules.

An arrangement of the type described in the opening paragraph is disclosed in Tietze, U. and Schenk. Ch.: Halbleiterschaltungstechnik, 5th edition, Springer-Verlag Berlin Heidelberg New York 1980, page 414. This prior art arrangement is a Schmitt triggering circuit constituted by an operational amplifier in the form of a comparator and in which a fraction of the output voltage is applied to the non-inverting input with the aid of a voltage divider. The alternating current signal is applied to the inverting input of the operational amplifier. If the voltage at the inverting input exceeds a positive threshold voltage, then the output voltage of the operational amplifier decreases abruptly to its lowest value; if it falls short of a negative threshold voltage, the output voltage suddenly increases to its highest value. If the voltage values of the alternating current signals are located between these two threshold voltages then the output voltage of the operational amplifier does not change.

The prior art arrangement has the disadvantage that the edges of the binary signal at the output of the operational amplifier are time-shifted relative to the zero positions of the alternating current signal. This unwanted phase shift depends on the level and the shape of the curve of the input signals and also on the threshold voltages. Finally, the prior art circuit produces a highly disturbed binary signal when the peak values of the alternating current signals are in the region of the threshold voltages. In the event of slight interferences in the alternating current signal it may namely happen that, for example, the positive threshold voltage is now frequently exceeded and consequently the change in the binary values occurring in the binary signal is a matter of change.

The invention has for its object to provide a circuit arrangement of the type described in the opening paragraph, in which the edges of the binary signal correspond to the best possible extent with the zeroes of the alternating current signal and which in spite of interferences produces a perfect binary signal with the frequency of the alternating current signal, as soon as the alternating current signal has first exceeded a threshold voltage.

This object is accomplished by means of the measures described in the characterizing part of patent claim 1.

The subclaim describes an advantageous embodiment.

The invention will now be described in greater detail by way of example with reference to the accompanying FIGURE which shows an embodiment of the invention.

An alternating current signal Ue is applied to the inverting input of a comparator K via a coupling capacitor C1 and a first input resistor R6. The non-inverting input of the comparator K is connected to the tap P of a first voltage divider R1, R2 via a second input resistor R7. In addition, a series arrangement of a resistor R3 and a capacitor C2 is arranged between the tap P and a point of reference potential.

The first voltage divider R1, R2 is arranged between the tap of a second voltage divider R4, R5 and the negative terminal of a direct voltage source having the voltage Uo, whose positive terminal is connected to the reference potential. The negative terminal of the direct voltage source carrying the voltage Uo is connected to the inverting input of the comparator K via a resistor R8. Via this connection the voltage −Uo is applied to the inverting input of the comparator K as long as the alternating current signal Ue is not switched on.

The binary signal Ua into which the alternating current signal Ue is to be converted, can be taken from the tap of the second voltage divider R4, R5. The second voltage divider R4, R5 is connected between the output of the comparator K and the positive pole of the voltage source which supplies the comparator K. The second voltage divider R4, R5 converts the two possible voltage values Umax and Umin at the output of the comparator K into non-negative voltages UH and UL (H represents "HIGH" and L represents "LOW") of the binary signal Ua, with which digital modules can then be driven. If the voltages Umax and Umin are already suitable for driving digital modules, the second voltage divider R4, R5 can be omitted; a terminal of the first voltage divider R1, R2 is then connected directly to the output of the comparator K.

As at the non-inverting input of the comparator K—because of its connection to the tap P of the first voltage divider R1, R2—a voltage exceeding −Uo is always present, the output voltage of the comparator K assumes, in the absence of the alternating current signal Ue, the value Umax and the voltage UH is then produced at the tap of the second voltage divider R4, R5. Before the alternating current signal Ue starts, the switching state of the comparator K is determined therewith; this condition is called the quiescent state. At the non-inverting input of the comparator K the voltage exceeds in the quiescent state the voltage at the inverting input by a value of $$\frac{(Uo + UH)R2}{R1 + R2}.$$

This quiescent threshold voltage must first be exceeded by the starting alternating current, before a change at the output of the comparator K occurs.

After the first change in condition at the output of the comparator K the resistor R3 and the capacitor C2 become active. These modules have for their result that the direct voltage difference between the inputs of the comparator K and the quiescent threshold voltage is reduced and in the operating condition fluctuates somewhat around the value $$\frac{UHR2}{R1 + R2},$$

the operating threshold voltage. Each time the operating threshold voltage is exceeded or fallen short off a change-over in the binary signal Ua occurs. By an appropriate choice of the resistors R1 and R2 the operating threshold voltage can be chosen such that the edges of the binary signal Ua occur substantially simultaneously with the zero crossings of the alternating current signal Ue. Because of the reduction in the threshold voltage an error-free binary signal Ua is always obtained as soon as the alternating current signal Ue has exceeded the high quiescent threshold voltage for the first time. If the level of the alternating current signal Ue has become so small that at first the operating threshold voltage cannot be exceeded, then the arrangement changes to its quiescent condition. If the level increases again then the alternating current signal Ue must again exceed the high-quiescent threshold voltage before the arrangement produces a binary signal Ua having the frequency of the alternating current signal. This switching hysteresis which results in the binary signal being switched on at a high level of the alternating current signal and being switched off at a low level, depends on the voltage Uo of the direct voltage source and can be set therewith.

A preferred embodiment as shown in the sole FIGURE had the following values and/or specifications for the elements:

| C1: 0.1 μF | C2: 0.1 μF | R1: 4.99 kΩ |
|---|---|---|
| R2: 1 kΩ | R3: 10 kΩ | R4: 3.01 kΩ |
| R5: 100Ω | R6: 3 kΩ | R7: 1 kΩ |
| R8: 3.09 kΩ | Uo: 2.5 V | K: Amplifier - Motorola MC 55107 with +5v, −5v at respective supply terminals. |

What is claimed is:

1. A circuit arrangement for converting an alternating current signal (Ue) into a binary output signal (Ua), wherein
    (a) the alternating current signal (Ue) is applied to the inverting input of a feed-back comparator having a non-inverting input and an output (K),
    (b) the feedback is effected through a first voltage divider (R1, R2) whose tap (P) is connected to the non-inverting input of the comparator (K) and the binary output signal (Ua) is applied to one terminal of the first voltage divider (R1, R2),
characterized in that,
    (c) another terminal of the first voltage divider (R1, R2) is connected to the negative pole of a direct voltage source (Uo) whose positive pole is connected to a reference potential,
    (d) the negative pole of said voltage source (Uo) is connected to the inverting input of the comparator (K) through a first resistor (R8),
    (e) the tap (P) of the first voltage divider (R1, R2) is connected through the series arrangement of a second resistor (R3) and a capacitor (C2) to the reference potential.

2. A circuit arrangement as claimed in claim 1, characterized in that a second voltage divider having a tap (R4, R5) is provided which is connected between the output of the comparator (K) and a positive pole of a power source which feeds the comparator (K), and in that the tap of the second voltage divider (R4, R5) is connected to said one terminal of the first voltage divider (R1, R2).

* * * * *